(12) United States Patent
Louzir et al.

(10) Patent No.: US 9,166,708 B2
(45) Date of Patent: Oct. 20, 2015

(54) APPARATUS AND METHOD FOR DETECTING MICROWAVE RADIATION

(71) Applicant: THOMSON LICENSING, Issy de Moulineaux (FR)

(72) Inventors: Ali Louzir, Rennes (FR); Jean-Yves Le Naour, Pace (FR); Jean-Luc Robert, Betton (FR)

( * ) Notice: Subject to any disclaimer, the term of this patent is extended or adjusted under 35 U.S.C. 154(b) by 12 days.

(21) Appl. No.: 14/029,720

(22) Filed: Sep. 17, 2013

(65) Prior Publication Data

US 2014/0080434 A1    Mar. 20, 2014

(30) Foreign Application Priority Data

Sep. 20, 2012   (EP) .................................... 12306138

(51) Int. Cl.
*H04B 17/00*   (2015.01)
*G01R 29/08*   (2006.01)

(52) U.S. Cl.
CPC .......... *H04B 17/004* (2013.01); *G01R 29/0871* (2013.01); *G01R 29/0892* (2013.01)

(58) Field of Classification Search
USPC ................ 455/67.11, 192.1, 192.2, 209, 214, 455/226.1, 229, 254; 375/331, 343, 344, 375/356, 366
See application file for complete search history.

(56) References Cited

U.S. PATENT DOCUMENTS

| | | | |
|---|---|---|---|
| 4,245,353 A | 1/1981 | Bynum | |
| 5,016,206 A * | 5/1991 | Shinonaga | 375/366 |
| 5,835,052 A | 11/1998 | Iwakuni | |
| 7,567,631 B2 * | 7/2009 | Birkett et al. | 375/331 |
| 8,090,333 B2 * | 1/2012 | Okada | 455/192.2 |
| 2010/0105345 A1 * | 4/2010 | Thampi et al. | 455/214 |
| 2010/0254267 A1 | 10/2010 | Blackwell | |
| 2011/0045809 A1 | 2/2011 | Yu et al. | |

FOREIGN PATENT DOCUMENTS

EP    0963051    12/1999
JP    2001116827    4/2001

OTHER PUBLICATIONS

Ashley et al: "The Measurement of Noise in Microwave Transmitters", IEEE Transactions on Microwave Theory and Techniques, vol. MIT-25, No. 4, Apr. 1, 1977, pp. 294-318.
Search Report Dated Feb. 14, 2013.
Anonymous, "ZPLUG-Prise télécommandable Zigbee TM", CLEODE Manuel, Jan. 27, 2012, pp. 1.
Taher et al., "Characterization of an Unintentional Wi-FI Interference Device—The Residential Microwave Oven", IEEE Military Communications Conference 2006, Washington, D.C., USA, Oct. 23, 2006, pp. 1-7.
Gawthrop et al., "Radio Spectrum Measurements of Individual Microwave Ovens", NTIA Report 94-303-1, vol. 1, U. S. Department of Commerce, Mar. 1994, pp. 1-100.

* cited by examiner

*Primary Examiner* — Thanh Le

(57) ABSTRACT

An apparatus for detecting microwave signals is suggested. The apparatus comprises an antenna for sending and receiving electromagnetic waves a circuit for detecting microwave signals and the signalization stage for generating an indication signal. In addition to that a method for detecting the presence of microwave signals is proposed.

6 Claims, 5 Drawing Sheets

APPARATUS AND METHOD FOR DETECTING MICROWAVE RADIATION

This application claims the benefit, under 35 U.S.C. §119 of European Patent Application 12306138.4, filed Sep. 20, 2012.

TECHNICAL FIELD

The invention is related to an apparatus and a method for detecting a microwave emitting device such as a microwave oven. In particular, the present invention is related to apparatus according to claim 1 and a method according to claim 5.

BACKGROUND

The deployment of sensor based systems offers many opportunities for providing new services and applications in the home. In particular, in the area of home networking, a Wi-Fi home gateway platform may include an interface with an advanced search and recommendation engine allowing home users to access their preferred or personalized content. In addition to that, background algorithms may utilize additional information which is collected in the home of the user to improve recommendations for media consumption or other purposes. Such kind of information includes e.g. time, date, and ambient temperature. In addition to that, it has been found useful to have information about the operating status of a microwave oven in a home. In conjunction with calendar and time information, the information about the operating status of a microwave oven enables an adapted algorithm to provide more insight into the living habits inside a home.

Information about the operational status of home appliances in general is interesting information also with regard to improving the management of power consumption in homes. In this context, there is an increasing demand for data about energy consuming devices. Energy disaggregation is a common keyword for this kind of research activities.

Combining the data collection in the home of a user with a residential gateway makes sense because the residential gateway provides an interface between a home network and a public network such as the Internet. The residential gateway comprises the full interaction between services and devices supported by the residential gateway which provides a number of additional enablers for supporting the home user. Multiple home devices are able to handle multiple media streams. The flows of media streams are directed to the most appropriate devices while other devices are informed about the incoming stream. Recording of media streams and associated information is supported if needed. Thus, in the gateway there is already plenty of information available to generate recommendations to users with regard to media consumption. Consequently, it also makes sense for the gateway to capture context information such as information about the operating status of a microwave oven in the home.

Modern gateways already support algorithms generating user recommendations based on a database about user preferences. Typically the database is built up over a long term. More advanced technologies also utilize the context information related to the user preferences and habits.

The context information includes e.g. the location of the user, activity, ambient temperature, lighting and others. Such kind of information can also include for example the operating status of a microwave oven indicating that at least one of the inhabitants of a home is about to have a warm meal.

A today existing possibility to detect the operation of a microwave oven is to connect the microwave oven to the mains with a radio controlled plug and socket, e.g. commercially available from Cleode (France). The radio controlled socket sends out its identifier in conjunction with the information that power is drawn from it. The combination of information allows concluding the microwave oven is operative once a monitoring software links a specific socket identifier with the microwave oven.

Taking this as a starting point the present invention aims at an alternative approach for detecting the operation of a microwave oven.

SUMMARY

According to a first aspect the present invention suggests an apparatus for detecting microwave signals. The apparatus comprises an antenna for sending and receiving electromagnetic waves, a circuit for detecting microwave signals, wherein the circuit (408) for detecting microwave signals comprises a memory (408) for storing the signature of a specific microwave signal and the signalization stage for generating an indication signal if the correlation between the received and the stored microwave signals exceeds a predetermined threshold value.

According to an embodiment of the invention the apparatus can comprise an FM demodulator.

In an advantageous embodiment the circuit for detecting microwave signals generates a feedback signal to the FM demodulator for correcting the center frequency of the FM demodulator.

According to a second aspect the present invention suggests a method for detecting the presence of microwave signals. The inventive method comprises the following steps:
  receiving and detecting a microwave signal;
  storing the signature of a specific microwave signal;
  correlating the received microwave signal with the previously stored signature of the microwave signal;
  generating an indication signal if the correlation between the received and the stored microwave signals exceeds a predetermined threshold value.

The development of the inventive method further comprises the step of adapting the center frequency of an FM demodulator used for the detection of the microwave signal.

In this case the method can further comprise the step of incrementing the center frequency of the FM demodulator to improve the detection of the microwave signal.

Advantageously the method can comprise the step of storing the signature of the received and detected microwave signal during an initialization phase.

In yet another embodiment the inventive method can further comprise the step of
  utilizing a first correlation threshold value during the initialization phase; and
  utilizing a second correlation threshold value which is higher than the first correlation threshold value after the initialization phase.

Further advantages of the present invention will become apparent when reading the detailed description in connection with the appended drawings.

BRIEF DESCRIPTION OF DRAWINGS

In the drawing, an embodiment of the present invention is shown. The same or similar components are labeled with same or similar reference numbers.

DESCRIPTION OF EMBODIMENTS

Figure 1:
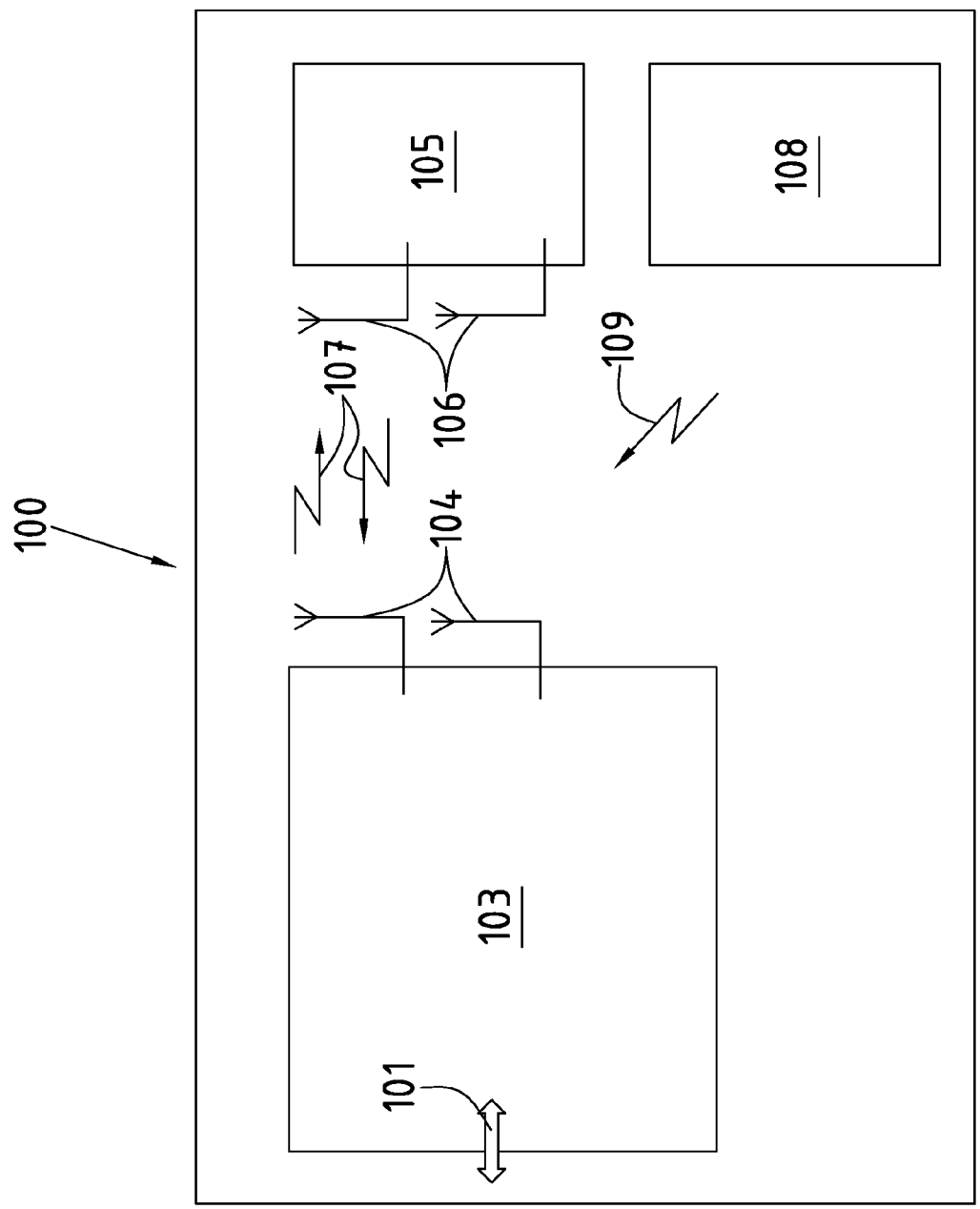
FIG. 1 schematically illustrates a room with a residential gateway, a set-top box, and a microwave oven.

FIG. 1 schematically illustrates a room 100. In the room 100 there is a gateway device 103 providing an access point to external networks such as PSTN, cable TV, and Internet. The access to external networks is symbolized in FIG. 1 by the double-headed arrow 101. Further details of the gateway 103 will be described further below in connection with FIG. 4. The gateway device 103 is provided with several transmission antennas 104. In the room there is also a set-top box 105 which is provided with several antennas 106. In FIG. 1 only two of the antennas 104 and 106, respectively, are shown. In other embodiments of the present invention the gateway device 103 and the set-top box 105 are provided with only one antenna each. The antennas 104 and 106 enable a wireless bi-directional communication between the gateway device 103 and the set-top box 105. This wireless communication is based on transmitted and received electromagnetic waves establishing wireless data communication between the devices. In FIG. 1 the electromagnetic waves travelling between the gateway 103 and the set-top box 105 are symbolized by arrows 107.

In the room 100 there is also a residential microwave oven 108. Usual residential microwave ovens are not radiation tight. The microwave oven 108 radiates leakage microwaves into the room 100 which are illustrated with arrow 109 in FIG. 1.

The residential microwave oven 108 comprises a magnetron to generate microwaves. The magnetron turns on and off at the mains frequency, i.e. at 50 Hz in Europe and 60 Hz e.g. in the US. In operation, the microwave oven generates microwaves in the ISM 2.4 GHz band.

In the ON mode the microwave oven signal is similar to a frequency modulated signal with a fixed carrier signal at 2.4 GHz and an instantaneous frequency that changes with time.

Figure 2:
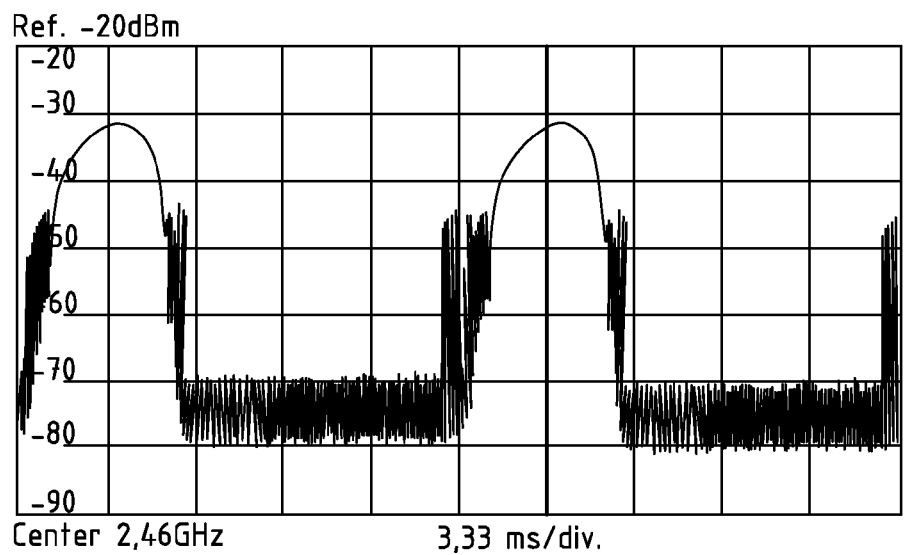
FIG. 2 displays the envelope of a microwave oven signal.

FIG. 2 shows the envelope of the microwave oven signal of an exemplary microwave oven which is operated at 60 Hz mains frequency. The envelope cycles between an ON and OFF state with a periodicity of 16.7 ms corresponding to 5 divisions on the abscissa in FIG. 2 (3.33 ms per division on the abscissa in FIG. 2). The frequency sweep of the radiated power is less than 20 MHz around a central frequency of 2.46 GHz. FIG. 2 shows a frequency sweep of the microwave oven signal during a few milliseconds between two transient phases. During the sweep, the radiated signal can be considered as an FM modulated signal with almost sinusoidal variation of the power.

Figure 3:
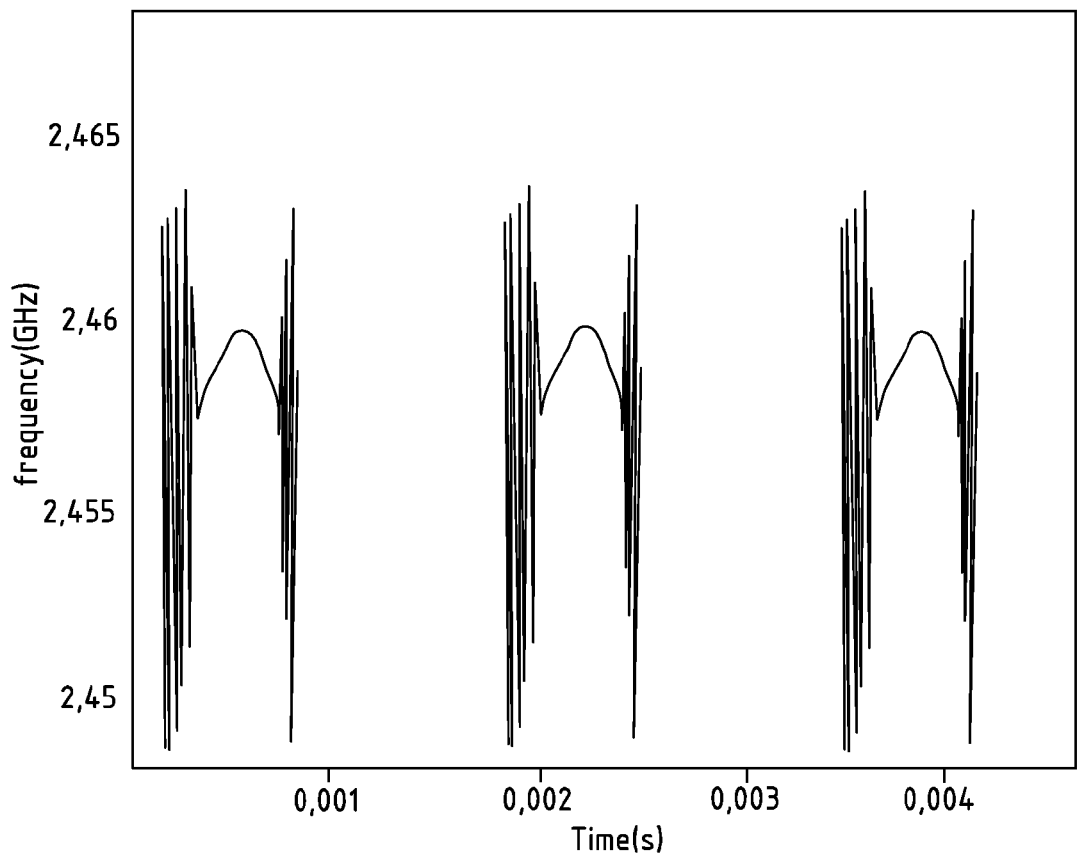
FIG. 3 shows a spectrogram of the signal shown in FIG. 2.

FIG. 3 shows a spectrogram of the microwave oven signal. Transient signals right before and after the frequency sweep are clearly visible.

The radiation leakage of microwave ovens allowed by regulations is comparable to the power transmitted by WiFi devices and is thus detectable by a properly designed detector.

The present invention makes use of radiation leakage in order to detect if the microwave oven 108 is in its ON or OFF state in room 100.

Figure 4:
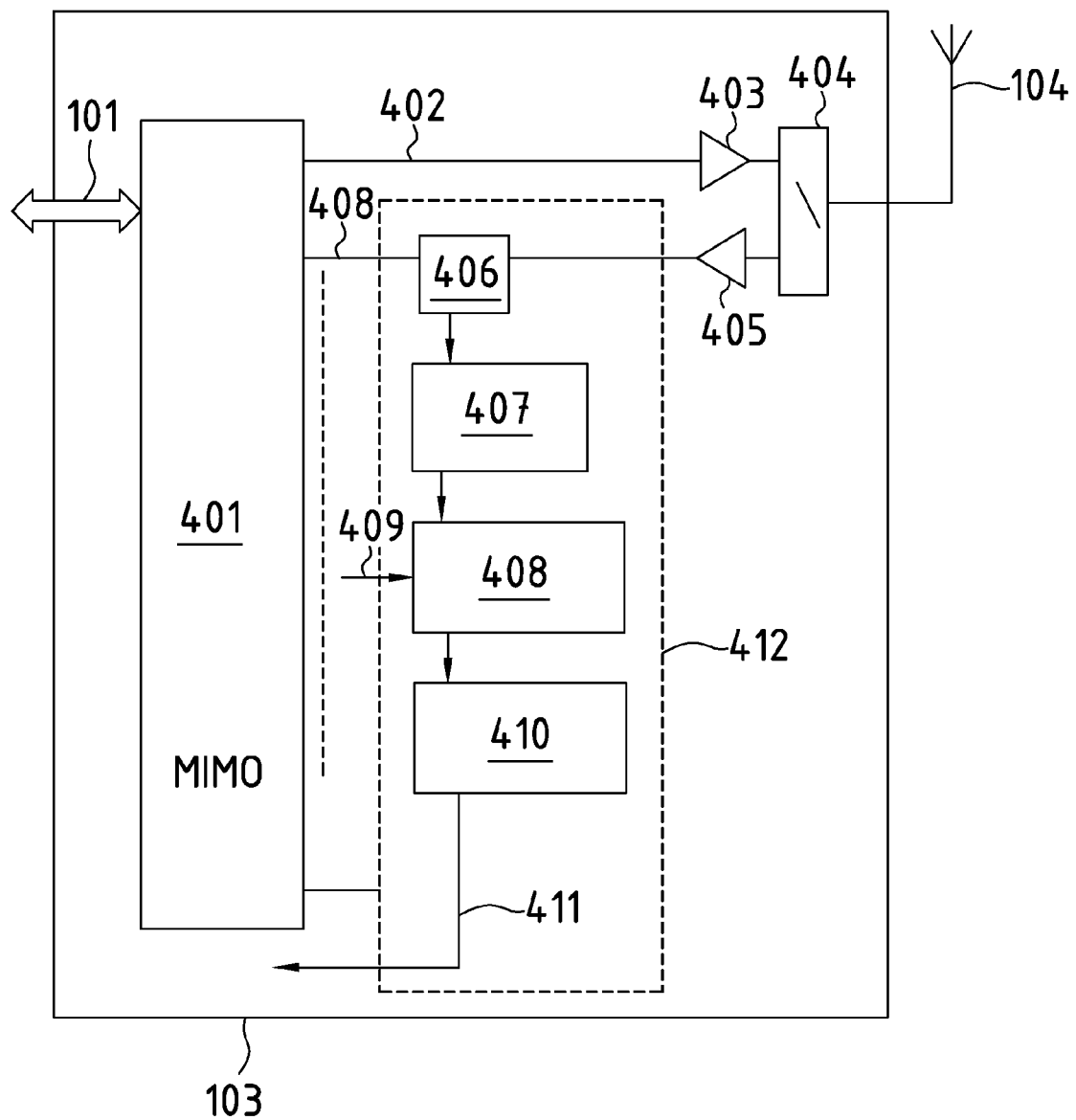
FIG. 4 shows a schematic block diagram of the residential gateway of FIG. 1.

FIG. 4 shows the gateway 103 in greater detail. The connection of the gateway 103 to external networks is symbolized with arrow 101 interfacing with a MIMO device 401.

One output 402 of the MIMO device 401 is connected with a power amplifier 403. By means of a selection, switch 404, the power amplifier 403 is connected to the antenna 104 when the gateway 103 is in a sending mode. When the gateway 103 is in a receiving mode to receive electromagnetic waves (RF signal), then the selection switch 404 changes its state and connects the antenna 104 with a low noise amplifier 405. The output of the low noise amplifier 405 is provided to an RF coupler 406. The RF coupler 406 provides an output signal on the one hand to an FM demodulator 407 and on the other hand to an input 408 of the MIMO device 401. The MIMO device forwards the received input signal to perform conventional signal processing in the gateway 103. The FM demodulator 407 filters the electromagnetic wave which is received by the antenna 104. The output of the FM demodulator 407 is provided to a microwave signal detection and storage circuit 408.

Since there is a certain variation in the radiation characteristics of different microwave ovens, the detection and storage circuit 408 records the characteristic "signature" of the microwave oven 108 during an initialization phase to improve the detection reliability. Also the exact central frequency of the microwave oven changes as a function of the operating temperature of the magnetron. In order to still limit the frequency sweep of the FM demodulator 407 to 10 to 20 MHz, a central frequency tracking system within the detection and storage circuit 408 provides a feedback signal 409 about the detected central frequency to the frequency demodulator 407. The circuit 408 communicates an output signal to a signalization stage 410 which generates an indication signal if the circuit 408 has detected a microwave signal. Then the signalization stage 410 produces an indication signal 411 for further usage in the gateway 103. The group of components comprising the RF coupler 406, the FM demodulator 407, the detection and storage circuit 408, and the signalization stage 410 form together a detection and signalization unit 412 shown with a dashed line in FIG. 4.

Figure 5:
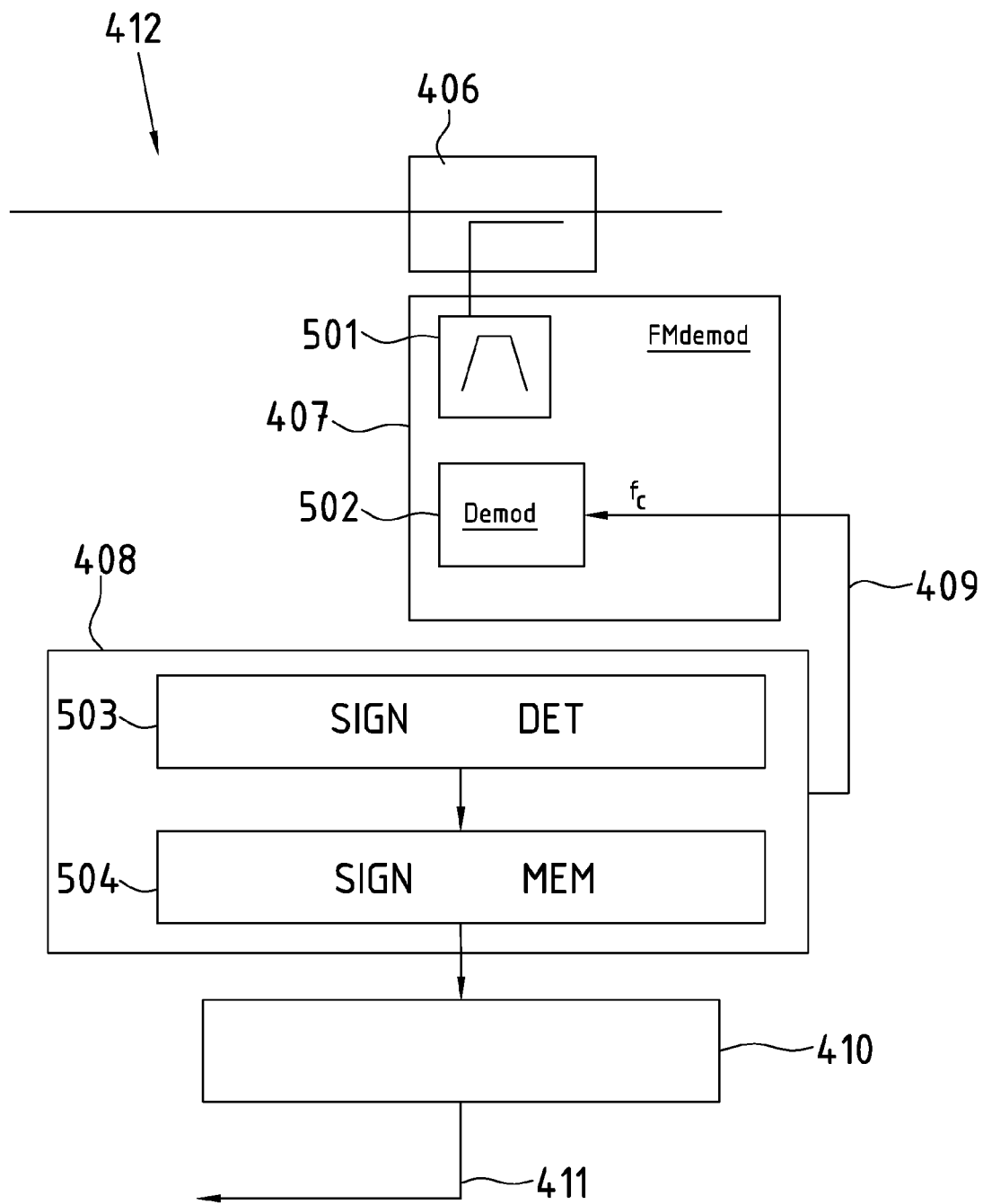
FIG. 5 shows a schematic block diagram of a modulation detector included in the residential gateway of FIG. 4.

FIG. 5 shows the detection and signalization unit 412 of FIG. 4 in greater detail. The RF signal received by the antenna 104 is coupled to the detection and signalization unit 412 by the RF coupler 406 and is provided to the FM demodulator 407.

The FM demodulator 407 comprises a passband filter 501 and a demodulator stage 502. The detection and storage circuit 408 comprises a detection stage 503 allowing detection of presence or absence of microwave. The circuit 408 also comprises the storage for storing the signature of the specific microwave signal which is characteristic for the specific microwave oven 108. The circuit 408 provides a feedback signal 409 of the detected center frequency of the microwave signal back to the demodulator stage 502 permitting a small frequency scan of 10 to 20 MHz of the demodulator stage 502 in spite of the fact that the center frequency of the microwave signal drifts e.g. as a function of the changing operating temperature of the magnetron of the microwave oven 108.

The output of the detection and storage circuit 408 is provided to the signalization stage 410 which generates an indication signal 411 indicating the presence or absence of a microwave signal.

Figure 6:
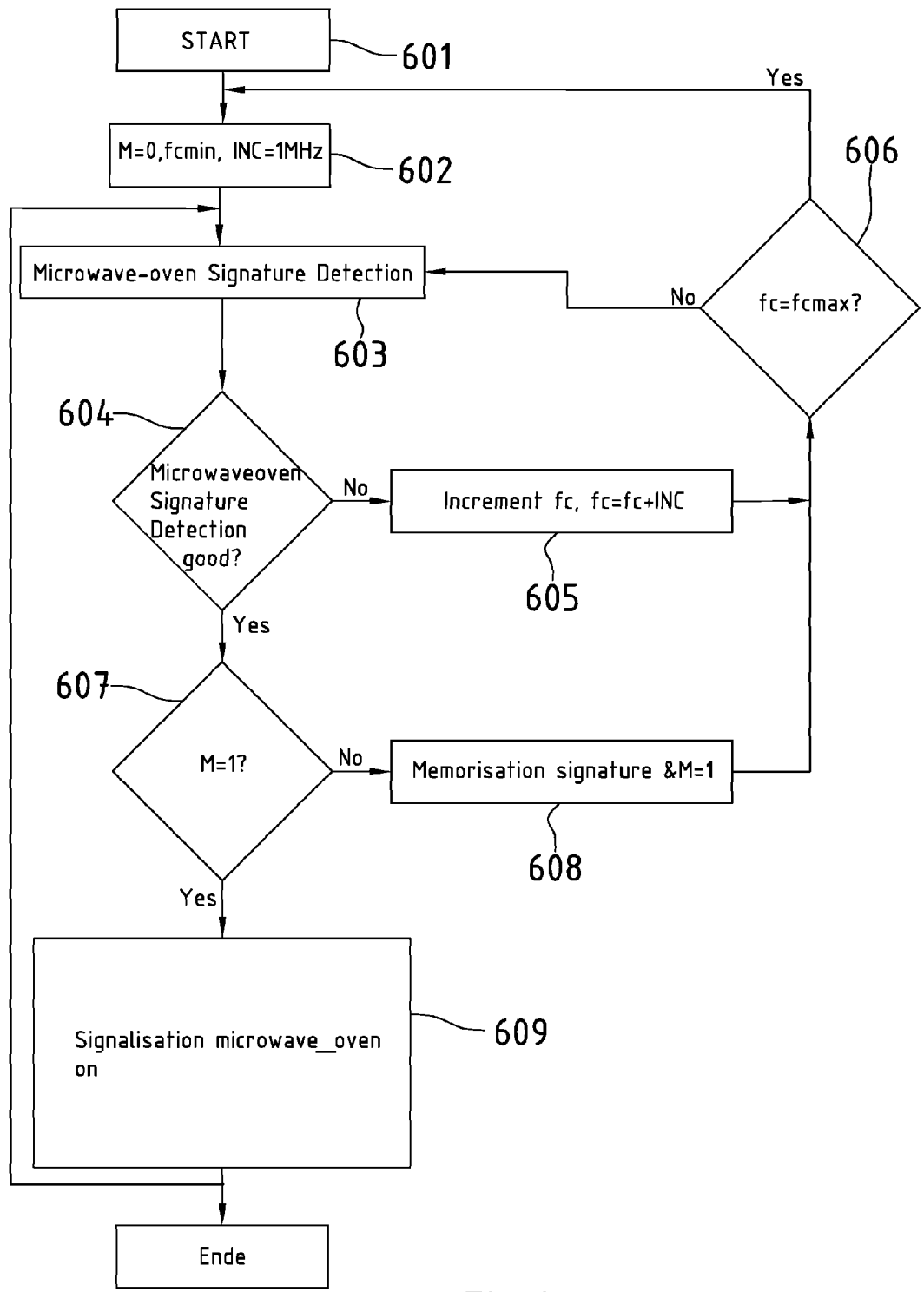
FIG. 6 displays a flow diagram illustrating an algorithm used by the invention.

FIG. 6 illustrates a flow diagram of an algorithm for identifying the signature of the microwave signal and for tracking its center frequency fc. After the algorithm is started (step 601) the next step 602 is to memorize the actual signature of the microwave signal leaking out of the microwave oven 108 during an initialization phase. Typically, the initialization phase takes place when the detection and signalization unit 412 detects the microwave signal for the first time. For the first detection the center frequency fc of the FM demodulator 407 is set to the lower threshold value fcmin of a known interval of typical center frequencies fc of microwave signals emitted by microwave ovens. The interval is described as [fcmin, fcmax] where fcmin is the lower limit and fcmax is the upper limit of the typical center frequency fc. Hence, the center frequency fc of the FM demodulator 407 is equal to fcmin after the start of the algorithm. Step 603 detects the microwave signal signature. In step 604 it is decided if the microwave signal detection is good or not based on the comparison with a predetermined correlation coefficient or correlation threshold value. If the signal detection is not good then the center frequency fc is incremented by 1 MHz. The increment value of 1 MHz is only an example and it can be chosen differently in other embodiments of the present invention. In step 606 it is decided if the center frequency of the demodulator 407 has already reached its maximum value fcmax. If this is not yet the case, then the loop including the steps 603, 604, 605, and 606 continues until it is decided in step 604 that the microwave signal detection is good.

Alternatively, if fc has reached its maximum value fcmax (fc=fcmax) then the process of detecting the microwave signal restarts at step 602, i.e. fc is reset to fcmin.

If the microwave signal is detected for the first time during the initialization phase the correlation threshold value which is used to decide if the detection is good or not is set to a low value to facilitate the detection during the initialization phase. This value is called here first correlation threshold value. For this purpose the parameter M is set to zero in step 602 (M=0). If the microwave signal has been detected for the first time after the initialization phase, the parameter M is still at M=0 when the algorithm arrives at step 607 and consequently the algorithm continues with step 608 where the signature of the microwave signal is stored and where the parameter M is changed and set to M=1. For all consecutive detections the parameter M remains at M=1 and the received microwave signal is compared with the microwave signal signature stored in the memory and the correlation threshold value is put to a higher value which is called here second correlation threshold value.

When a microwave signal is detected again by the FM demodulator 407, then it is correlated to the stored microwave signal signature. If the measurement correlation coefficient is above the fixed threshold value then the microwave oven 108 is ON and an indication signal is transmitted in step 609 for further processing by an application running in the gateway 103.

REFERENCE SIGNS LIST

100 room
101 double-headed arrow
103 gateway device
104 antenna
105 set-top box
106 antenna
107 arrow (electromagnetic waves)
108 microwave oven
109 arrow (leakage microwaves)
401 MIMO device
402 output of MIMO device
403 power amplifier
404 selections switch
405 low noise amplifier
406 RF coupler
407 FM demodulator
408 detection and storage circuit
409 feedback signal
410 signalization stage
411 indication signal
412 detection and signalization unit
501 passband filter
502 demodulator stage
503 detection stage
504 storage for microwave signature
601-609 method steps

The invention claimed is:

1. Apparatus for detecting microwave signals, wherein the apparatus comprises an antenna for sending and receiving electromagnetic waves, a circuit for detecting microwave signals, wherein the circuit for detecting microwave signals comprises a memory for storing a signature of a specific microwave signal during an initialization phase, wherein the circuit for detecting microwave signals is configured to utilize a first correlation threshold during the initialization phase and is configured to correlate received and stored microwave signals utilizing a second correlation threshold which is different from the first correlation threshold after the initialization phase, and wherein the apparatus further comprises a signalization stage for generating an indication signal if the correlation between the received and the stored microwave signals exceeds the second correlation threshold.

2. Apparatus according to claim 1, comprising an FM demodulator.

3. Apparatus according to claim 2, wherein the circuit for detecting microwave signals generates a feedback signal to the FM demodulator for correcting a center frequency fc of the FM demodulator.

4. Method for detecting the presence of microwave signals, wherein the method comprises:
receiving and detecting a microwave signal;
storing a signature of the received and detected microwave signal during an initialization phase
utilizing a first correlation threshold during the initialization phase;
correlating the received microwave signal with the previously stored signature of the microwave signal;
utilizing a second correlation threshold which is different from the first correlation threshold after the initialization phase; and
generating an indication signal if the correlation between the received and the stored microwave signals exceeds the second correlation threshold.

5. Method according to claim 4 further comprising adapting a center frequency fc of an FM demodulator used for the detection of the microwave signal.

6. Method according to claim 5 further comprising incrementing the center frequency of the FM demodulator to improve the detection of the microwave signal.

* * * * *